(12) United States Patent
Sri-Jayantha et al.

(10) Patent No.: US 11,245,075 B2
(45) Date of Patent: Feb. 8, 2022

(54) OPTIMUM WARP IN ORGANIC SUBSTRATES

(71) Applicant: International Business Machines Corporation, Armonk, NY (US)

(72) Inventors: Sri Sri-Jayantha, Ossining, NY (US); Vijayeshwar Khanna, Millwood, NY (US); Arun Sharma, New Rochelle, NY (US); Hien Dang, Nanuet, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/882,704

(22) Filed: May 25, 2020

(65) Prior Publication Data

US 2021/0367152 A1   Nov. 25, 2021

(51) Int. Cl.
*H01L 51/00* (2006.01)

(52) U.S. Cl.
CPC ...... *H01L 51/0015* (2013.01); *H01L 51/0026* (2013.01); *H01L 2251/105* (2013.01)

(58) Field of Classification Search
CPC ............. H01L 51/0015; H01L 51/0026; H01L 2251/105; H01L 23/49866;
(Continued)

(56) References Cited

U.S. PATENT DOCUMENTS 6,849,935 B2   2/2005 Palanisamy
7,358,189 B2   4/2008 Yamamoto et al.
(Continued)

FOREIGN PATENT DOCUMENTS

JP   2005167141   6/2005
JP   3927076      6/2007

OTHER PUBLICATIONS

Murayama, K., Aizawa, M., Hara, K., et al. (2013). Warpage control of silicon interposer for 2.5 D package application. Electronic Components and Technology Conference (ECTC), 2013 IEEE 63rd, pp. 879-884: See figure 11 & pp. 879 & 883.

*Primary Examiner* — Ermias T Woldegeorgis
(74) *Attorney, Agent, or Firm* — Daniel P. Morris; Lou Percello, Attorney, PLLC

(57) ABSTRACT

An organic substrate and method of making with optimal thermal warp characteristics is disclosed. The organic substrate has one or more top layers and one or more bottom layers. A chip footprint region is a surface region on each of the top and bottom layers that is defined as the projection of one or more semiconductor chips (chips) on the surface of each of the top and bottom layers. One or more top removal patterns are located on and may or may not remove material from the surface of one or more of the top layers within the chip footprint region of the respective top layer. One or more bottom removal patterns are located on and remove material from the surface of one or more of the bottom layers outside the chip footprint region of the respective bottom layer. The removal of the material from one or more of the top layers and/or bottom layers changes and optimizes a thermal warp of the organic substrate. In some embodiments, a Shape Inversion Temperature (SIT) of the substrate is made equal to or above a reflow temperature.

18 Claims, 14 Drawing Sheets

(58) Field of Classification Search
CPC ............ H01L 23/49822; H01L 23/562; H01L 23/145; H01L 23/49838; G06F 30/392; G06F 30/20
See application file for complete search history.

(56) References Cited

U.S. PATENT DOCUMENTS

| | | |
|---|---|---|
| 8,217,271 B2 | 7/2012 | Okazaki |
| 8,345,955 B2 | 1/2013 | Dang et al. |
| 8,631,568 B2 | 1/2014 | Yamada et al. |
| 8,877,552 B2 | 11/2014 | Sri-Jayantha |
| 9,543,253 B2 | 1/2017 | Blackshear et al. |
| 9,659,131 B2 | 5/2017 | Blackshear et al. |
| 2012/0309187 A1 | 12/2012 | Sri-Jayantha et al. |
| 2013/0334711 A1* | 12/2013 | Blackshear ........... G06F 30/392 257/778 |

* cited by examiner

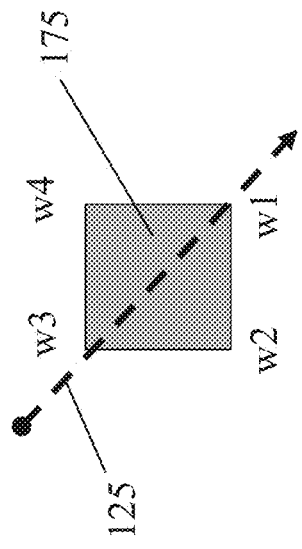

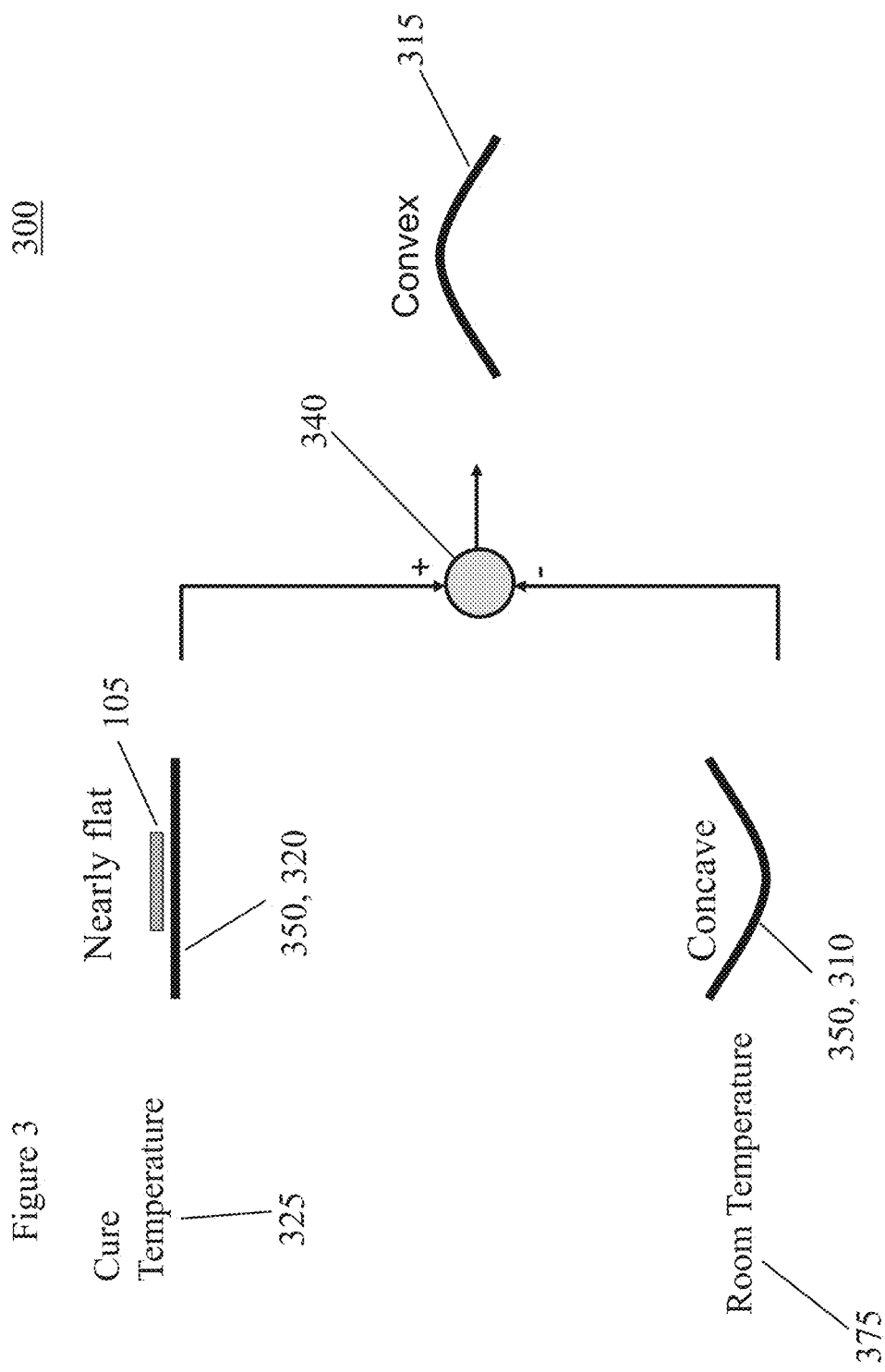

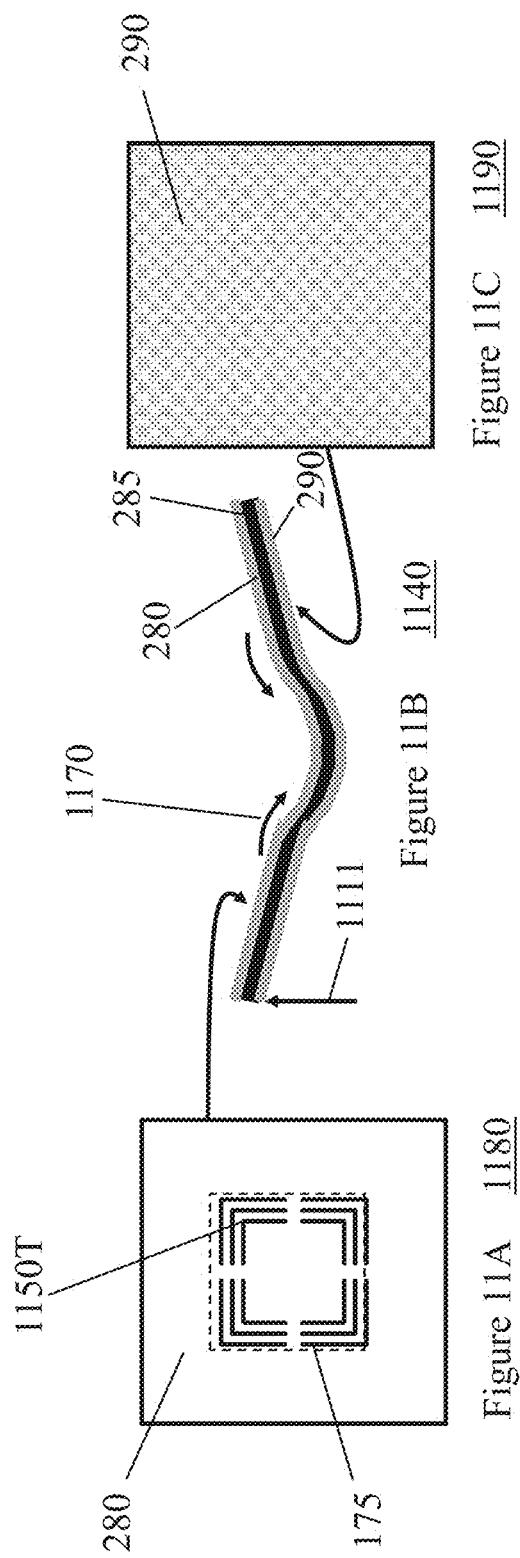

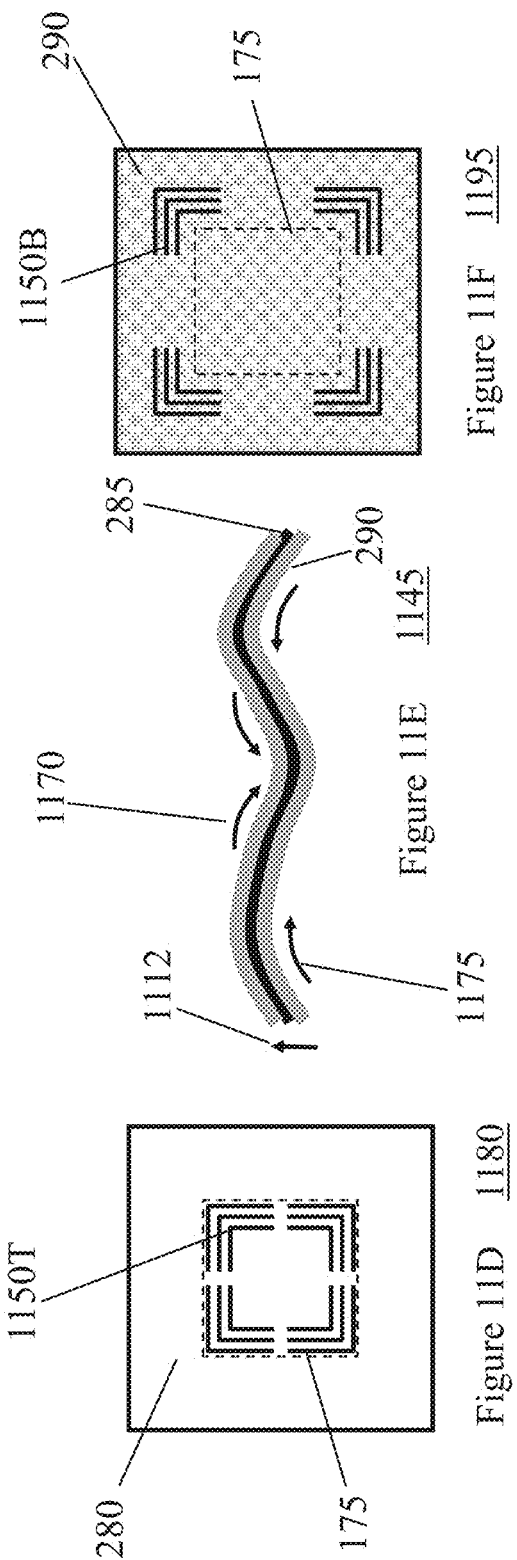

OPTIMUM WARP IN ORGANIC SUBSTRATES

BACKGROUND

The present invention relates to minimizing and optimizing warp in organic substrates. More particularly, the invention relates to optimizing warp in organic substrates used with electronic packages at room temperature and at reflow conditions.

Organic substrates used in electronic packages must meet two basic warp centered requirements. First it must meet an industry standard room temperature warp for overall substrate (typically about 150 micrometers, μm) and for the chip-site coplanarity (30 μm). Second it must facilitate good chip joining characteristics in during the reflow condition. Field experience shows that a concave warp near reflow temperature (e.g. between 175 and 250 Celsius) is more conducive to chip joining whereas a convex shape results in poor chip joining yield.

Organic substrates typically have a core about 400-800 μm thick made of fiber reinforced organic or resin material. In order to reduce cost, the core is eliminated in some substrates, e.g. a coreless substrate. The metal interconnects are progressively built layer by layer on the top and bottom of the core by a series of process steps. The steps involve electroless-plating, electroplating, etching, polishing, placement of dielectric resin, high temperature pressing of resin, etc. Each circuit interconnect layer or a power or a ground plane is separated by a sheet of photosensitive resin. Laser drilling of the resin and electroplating processes are used to fabricate vias that help connect various layers. Multi-stack vias are used to link layers that are further apart within the build layers of a substrate.

The buildup layers between the chip/die and the core are referred to as "FC" layers (Front Circuit), and the layers on the side of the core opposite the chip are referred to as "BC" (Bottom Circuit) layers. Since each metal layer is designed to optimize electrical performance, the mechanical characteristic of each layer is not precisely controlled. The FC layers generally have dense interconnect structure made of metal lines, typically etched from a layer of copper deposited by means of a plating process. The BC layers on the other hand tend to have a continuous sheet of copper with distributed holes for vias to pass through. Such a configuration inevitably leads to a substrate with asymmetric thermomechanical properties when viewed with respect to the center plane of the core.

A substrate design with asymmetric thermomechanical parameters produces a warp when constructed at high temperature and cooled down to room temperature. Electronic manufacturing and assembly operations incorporating a substrate require a minimum acceptable warp. For example, for a substrate with a 55×55 mm dimension in an X-Y planar surface, a warp up to 150 μm is considered acceptable. As the number of buildup layers and core thicknesses are changed, the warp levels can change according to their interaction. The yield of substrates can be reduced if the parametric symmetry is not maintained within corresponding limits.

There is a need to improve yields of organic substrates, including those carrying semiconductor chips (chips) by optimizing warp of the substrate both at room temperature and during reflow conditions.

SUMMARY

According to one or more embodiments, the present invention is an organic substrate and method of making the organic substrate with optimal thermal warp characteristics. The organic substrate has one or more top layers layered on top of one another and one or more bottom layers layered on top of one another. The top layers are disposed on the bottom layers. In some embodiments an optional core or multiple core layers are disposed between the top layers and the bottom layers. In some embodiments, where the core is not present, the core is a hypothetical plane separating the top layers and bottom layers.

A chip footprint region is a surface region on each of the top and bottom layers that is defined as the projection of one or more semiconductor chips (chips) on the surface of each of the top and bottom layers.

One or more top removal patterns is located on and is where material is removed from the surface of one or more of the top layers within the chip footprint region of the respective top layer. In some embodiments, no material is removed from the top layer(s) but is only removed from the bottom layer(s).

In some embodiments, one or more bottom removal patterns is located on and is where material is removed from the surface of one or more of the bottom layers outside the chip footprint region of the respective bottom layer.

The removal of the material from one or more of the top layers and/or bottom layers changes a thermal warp of the organic substrate. Thermal warp is change in warp at given locations of a substrate for a given temperature change.

In some embodiments, a Shape Inversion Temperature (SIT) of the substrate is made equal to or above a reflow temperature. The SIT is the temperature at which the organic substrate changes in shape from concave to convex and the reflow temperature is the temperature at which a solder melts to form a connection between one or more chips and the organic substrate.

Methods of making the organic substrate with optimal thermal warp characteristics are disclosed.

BRIEF DESCRIPTION OF THE DRAWINGS

Various embodiments of the present invention will be described below in more detail, with reference to the accompanying drawings, now briefly described. The Figures show various apparatus, structures, and related method steps of the present invention.

FIG. 1A is an illustration showing an organic substrate below a semiconductor chip (chip) where the substrate has a concave shape near reflow temperature.

FIG. 1B is an illustration showing an organic substrate below a chip where the substrate has a convex shape near reflow temperature.

FIG. 1C is an illustration of a top view of a footprint the chip on the substrate showing the four corners of the footprint and a diagonal transect line.

FIG. 3 is an illustration of a definition of thermal warp of an organic substrate.

FIG. 11A is a top horizontal cross section view of one or more of the top layer embodiments of a typical organic substrate with surface material removed within the footprint.

FIG. 11B is a cross section elevation view of the organic substrate of FIG. 11A.

FIG. 11C is a top, horizontal cross section view of one of the bottom layer embodiments with a metal, e.g. copper surface plating.

FIG. 11D is a top horizontal cross section view as shown in FIG. 11A with a chevron-like removal pattern within the footprint.

FIG. 11E is a cross section elevation view of the organic substrate shown in FIG. 11D.

FIG. 11F is a top, horizontal cross section view of one of the bottom layer embodiments with material removed from the surface of one or more bottom layers in a removal pattern outside the footprint.

DETAILED DESCRIPTION

Figures 2A, 2B:
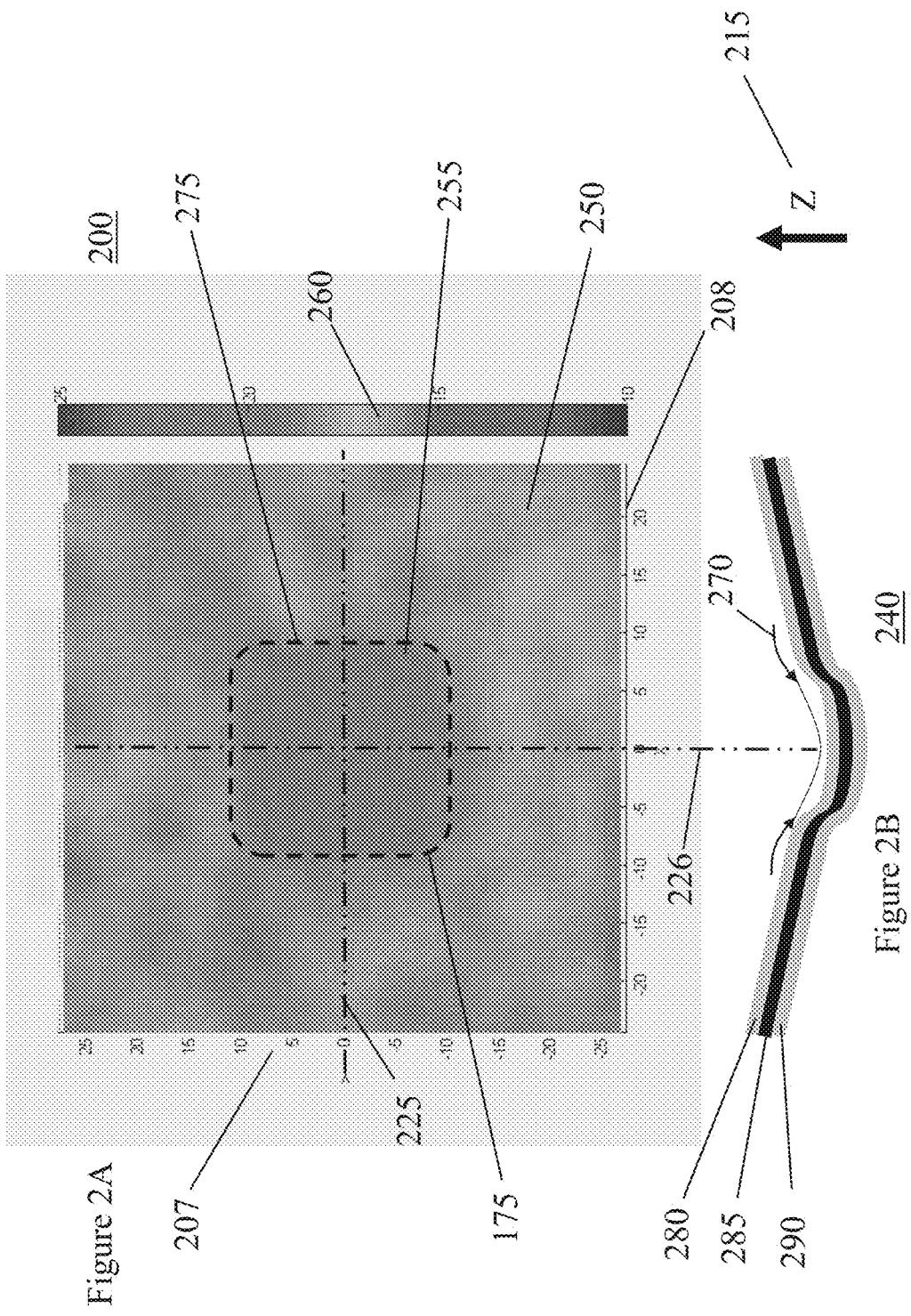
FIG. 2A is a graph of an experimentally measured and computed effective coefficient of thermal expansion (CTE) of a 55 mm square substrate as a function of distance from a centerline.
FIG. 2B is an illustration of a cross section of the organic substrate showing one or more top layers, one or more center or core layers, and one or more bottom layers of the substrate.

It is to be understood that embodiments of the present invention are not limited to the illustrative methods, apparatus, structures, systems and devices disclosed herein but instead are more broadly applicable to other alternative and broader methods, apparatus, structures, systems and devices that become evident to those skilled in the art given this disclosure.

In addition, it is to be understood that the various layers, structures, and/or regions shown in the accompanying drawings are not drawn to scale, and that one or more layers, structures, and/or regions of a type commonly used may not be explicitly shown in a given drawing. This does not imply that the layers, structures, and/or regions not explicitly shown are omitted from the actual devices.

In addition, certain elements may be left out of a view for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures may not be repeated for each of the drawings.

The semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, neural networks, etc. Systems and hardware incorporating the semiconductor devices and structures are contemplated embodiments of the invention.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional or elevation views measured from a top surface to a bottom surface of the element. Terms such as "thick", "thickness", "thin" or derivatives thereof may be used in place of "height" where indicated.

As used herein, "lateral," "lateral side," "side," and "lateral surface" refer to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

FIG. 1A is an illustration 100 showing an organic substrate 150 below a semiconductor chip (chip) 105 where the substrate 150 has a concave shape 110 near reflow temperature. An example C4 connection 130 is shown in contact with the substrate 150 showing an example connection between the chip 105 and the substrate 150. In this example, the connection is good because the concave shape 110 of the substrate 150 due to the substrate 150 warp enables the C4 connection during reflow of the solder making up the C4 connection. Accordingly, a concave shaped 110 warp is preferred for these electrical connections to the chip 105 because a concave shaped 110 warp causes fewer connection failures.

FIG. 1B is an illustration 140 showing an organic substrate 150 below a chip 105 where the substrate 150 has a convex shape 115 near reflow temperature. The convex shaped 115 substrate 150 is less preferred for connections (e.g. C4) between the chip 105 and substrate 150 because the gap 135 distance between the chip 105 and substrate 150 increases for convex shaped 115 substrates 150 (particularly at chip edges) and the melted solder tends to flow away from making a connection at reflow temperatures. Accordingly, a convex shaped 115 warp in the substrate 150 at reflow temperatures causes more connection failures, lower device yields, and is least preferred.

FIG. 1C is an illustration 170 of a top view of footprint 175 the chip 105 projection on the substrate 150 showing the footprint 175 of the four corners of the chip 105: w1, w2, w3, and w4. A diagonal transect line 125 is drawn between opposite corners of the chip footprint (footprint) 175, e.g. from corner w3 to corner w1. For some preferred measurements of warp, a vertical distance (not shown) is taken at each of one or more points along the diagonal transect line 125 from a horizontal plane to the "bare" (without chip) substrate 150 surface.

Other measurements of warp include a "4-corner" mean warp measurement, i.e. an "average 4-corner warp". An average 4-corner warp is determined by taking the mean value of the vertical deflection, d, (not shown) at each chip 105 corner (w1, w2, w3, w4) location/projection on the bare substrate 150 surface. For example:

Average 4-corner warp=$(d1+d2+d3+d4)/4$ where d1 is the vertical deflection of the bare substrate at the w1 corner location, d2 is the vertical deflection at w2, etc.

FIG. 2A is a graph 200 of an experimentally measured and computed effective coefficient of thermal expansion (CTE) of a 55 mm square substrate 250 as a function of distance from a centerline (225, 226) in both the X 225 and Y 226 directions. The distance from the centerline (225, 226) of the chip location 275, within the chip footprint 175, is measured on the Y-axis 205 and X-axis 210, respectively The magnitude of the CTE at a given X,Y location on the substrate 250 is given by a grey scale on a legend 260.

As observed, the region 255 within the footprint 175 experiences the largest CTE of the entire of the surface of the substrate 250.

FIG. 2B is an illustration of a cross section 240 of the organic substrate 250 showing one or more top layers 280, one or more center or core layers 285, and one or more bottom layers 290 of the substrate 250.

The cross section 240 shows that there is more deformation 270 in the Z-direction 215 in the substrate 250 at locations closer to the centerline 226. More specifically, the deformation 270 increases within the chip footprint 175 region 255 and becomes greater with locations within/under the footprint 175 region 255 that are closer to the centerline 226 (and 225).

As a result of the greater CTE effect within/under the footprint 175 region 225, there is a tendency the top layer(s) to contract/shrink more (in the X-direction as shown in the cross section 240) with respect to the bottom layer(s) during temperature cooling. As the substrate 250 is cured at a higher temperature, say 175 degrees Celsius (C), and cooled down to room temperature, a concave shape 110 (e.g. facing upward) of the substrate 250 is typically developed.

FIG. 3 is an illustration of a definition of thermal warp 300 of an organic substrate (150, 250).

The thermal warp 300 component is defined as the change in warp for a given temperature change. For an ideal substrate (150, 250) design, the thermal warp component 300 of the substrate (150, 250) would be minimized to zero. However, real substrates (150, 250) always exhibit a degree of thermal warp. Usually, the warp is near zero at cure temperature.

The cure temperature is chosen by the manufacturers of substrates (150, 250). Usually it is about 180 C. The substrate (350, 320) is shown as flat 320 in relation to the chip 105 at cure temperature 325. The substrate (350, 310) is shown as concave 310 at room temperature 375. The reason for this concave shape 310 is explained in FIG. 2A.

Incidentally, since the warp deformation of the substrate 350 surface cooling down from cure temperature to room temperature 375 is typically in a downward Z-direction, with respect to the chip 105, the down direction is chosen 340 as positive for measuring thermal warp 300. Therefore, actual concave deformations 310 measure actually in the negative Z direction 215 but are inverted 340 to give a positive, or convex 315 measurement of thermal warp 300.

Figure 4:
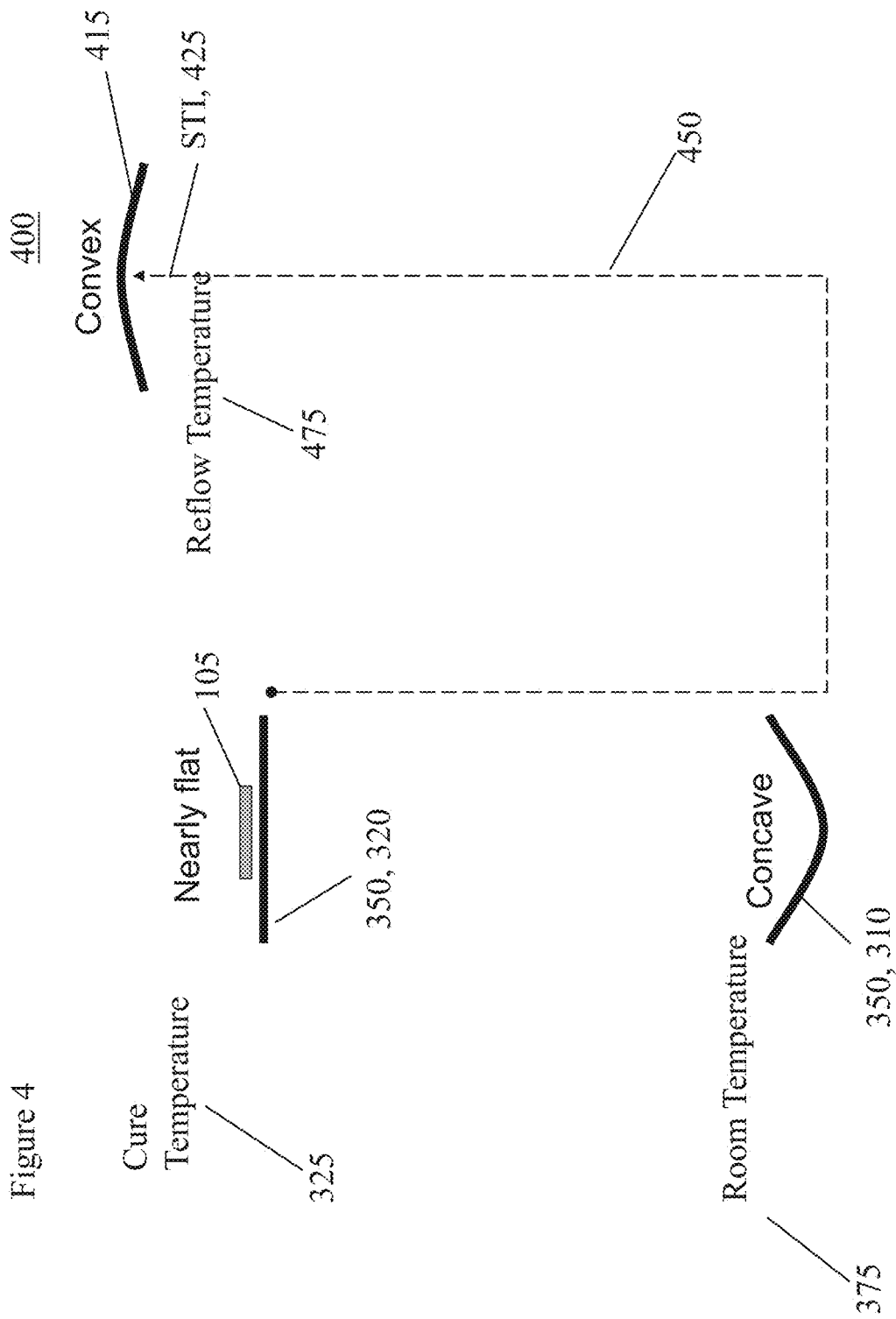
FIG. 4 is an illustration of the effect that temperature changing or cycling, e.g. from cure temperature to room temperature to reflow temperature, has on the actual warp of the substrate.

FIG. 4 is an illustration 400 of the effect that temperature changing or cycling 450, e.g. from cure temperature 325 to room temperature 375 to reflow temperature 475, has on the actual warp of the substrate 350.

Specifically, FIG. 4 shows a potential condition where a substrate vendor cures the substrate 350 at a cure temperature 325 much lower than the reflow temperature 475. For a substrate 350 with a finite thermal warp, the concave shape 310 of the substrate 350 at room temperature 375 can become reversed to convex 415 shape above the cure temperature 375. Therefore, there is a change in shape of the substrate 350 that occurs at a given temperature which is most likely near and above the cure temperature 325 used to make the substrate 350. We refer to this temperature as shape inversion temperature (SIT) 425.

Note that the reflow temperature 475 is the temperature at which the solder connections 130 are reflowed to make connections between the chip 105 and the substrate 350. If there is a SIT 425 at or below the reflow temperature 475 and the substrate 350 has a convex shape 415 at reflow as a result, the connections made at the reflow temperature 475 are more likely to be faulty because of the convex shape 415 of the substrate 350.

Figure 5:
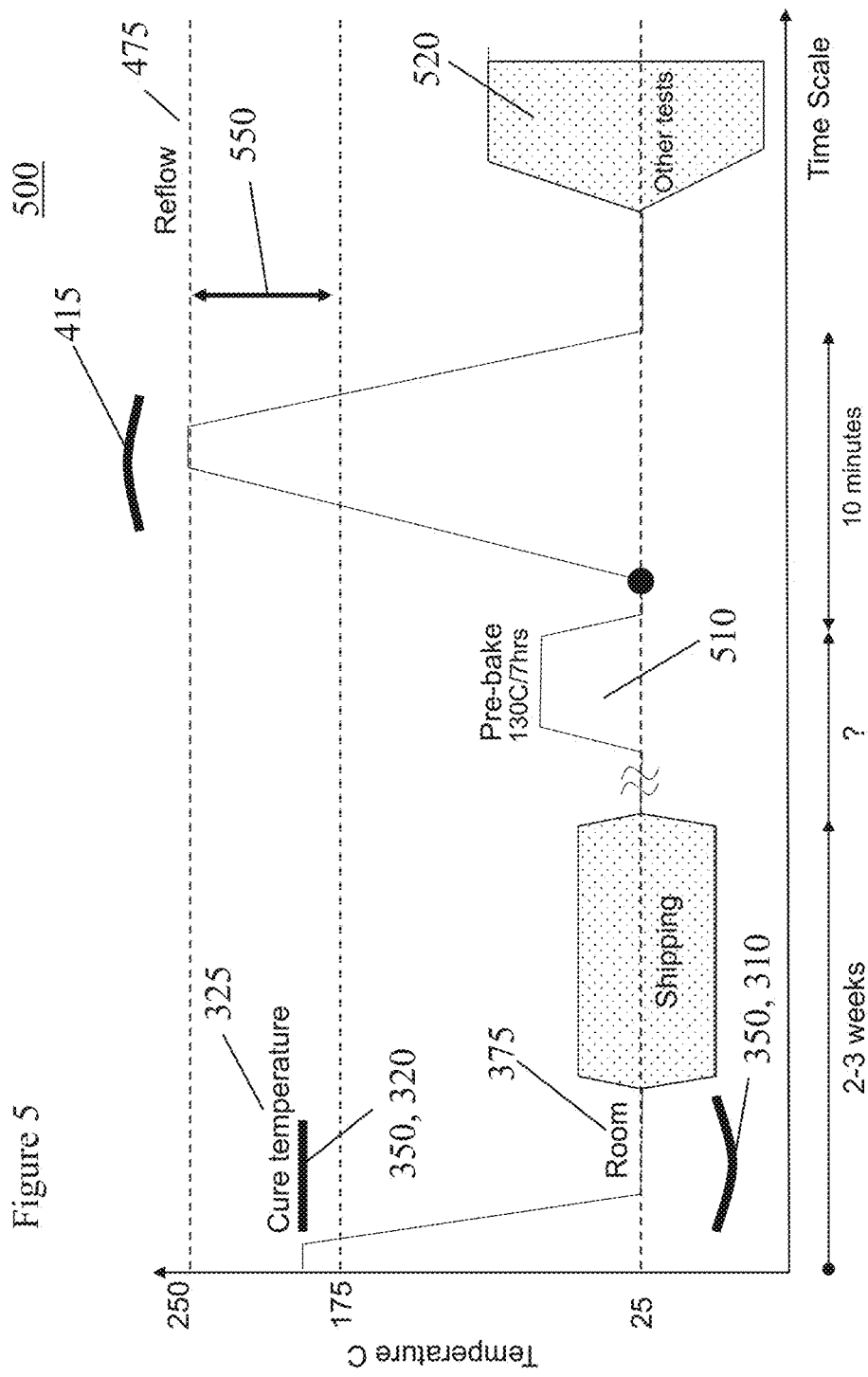
FIG. 5 is an illustration of the effect of changes of temperature in the reflow process has on the thermal warp of a bare (no chip) substrate.

FIG. 5 is an illustration of the effect of changes of temperature in the reflow process has on the thermal warp of a bare (with no chip) substrate, typically 150.

FIG. 5 shows a typical thermal/temperature history 500 of an organic substrate (150, 250, 350, typically 150) over a period of time. The typical temperature history 500 begins with creation of the substrate 150 at the cure temperature 325. Then the substrate (150, 350) cools to room temperature 375. As discussed, the shape of the substrate (150, 350) goes from flat 320 at cure temperature 325 to concave 310 at room temperature 375. The substrate 150 remain at room temperature 375 for an unknown length of time, e.g. during storage and shipping. As the substrate (150, 350) is assembled there is a pre-bake period 510 where the substrate (150, 350) is heated to a pre-bake temperature of about 130 C for about 7 hours. Thereafter the temperature is raised to the reflow temperature 475 to make the electrical and mechanical connections between the chip 110 and the substrate (150, 350). After the reflow, the substrate (150, 350)

is again cooled to room temperature 375 where other testing 520 is performed and the components go to the next stage of manufacturing.

In many situations, the cure temperature 325 tends to be lower than reflow temperature 475. Lower cure temperature can reduce the room temperature warp 310. But it can exaggerate the chip-site warp 415 at reflow 475. Lowering the cure temperature 325 too much can cause the reflow temperature to increase more than a detrimental temperature increase 550 above the cure temperature 325. At or within the detrimental temperature increase 550 there is a high risk of reaching the SIT 425 that will drive the shape of the substrate (150, 350) into a convex 115 warp and increase the number of connection failures.

Figure 6:
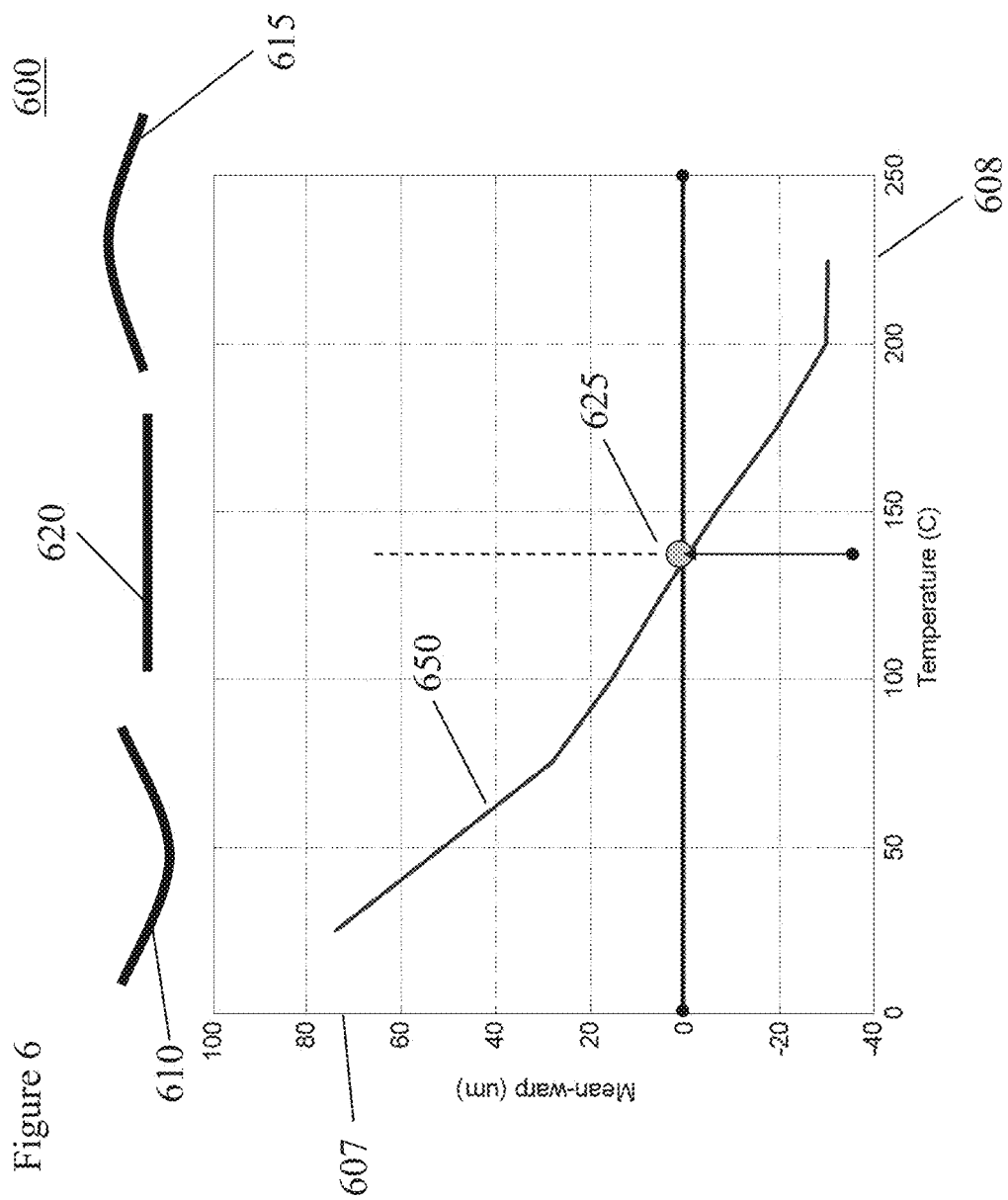
FIG. 6 is a graph of mean warp, e.g. average 4-corner warp, of a substrate showing a Shape Inversion Temperature.

FIG. 6 is a graph 600 of mean warp, e.g. average 4-corner warp 607, on the Y-axis 607 as a function of Temperature (C), on the X-axis 608, illustrating Shape Inversion Temperature (STI) 425.

FIG. 6 shows an experimental warp data/curve 650 of a given substrate-A 150 that resulted in convex shape 615 at reflow temperature 475. The SIT temperature (425, 625) is about 140 C. The warp is computed as the average displacement for 4 corners of the substrate 150 normal to a flat plane (in the Z-direction 215), as described above.

Below the STI temperature (425, 625) the warp data/curve is positive and the substrate 150 shape is concave (110, 610). Above the STI temperature (425, 625) the warp date/curve is negative and the substrate 150 shape is convex (615, 115). The substrate 150 is flat (320, 620) where the substrate 150 has an average 4-corner warp of zero. Therefore, we can determine where the substrate 150 shape transitions from concave (110, 610) to convex (115, 615) by plotting a warp curve or mean warp curve 650, e.g. the average 4-corner warp versus temperature and determining the temperature at which the curve 650 crosses zero mean warp.

Figure 7:
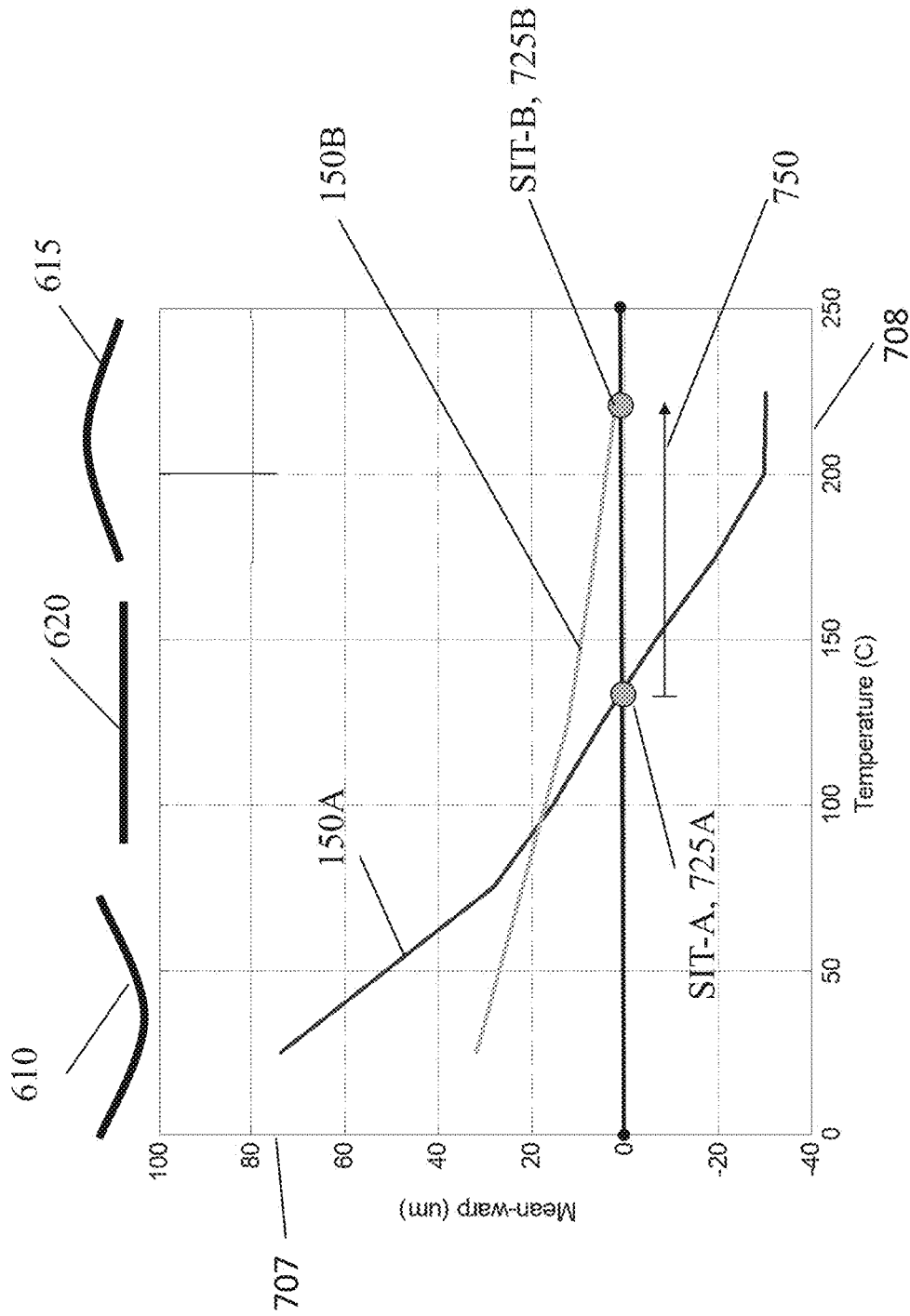
FIG. 7 is a graph of mean warp versus Temperature (C) illustrating a shift in the Shape Inversion Temperature (STI).

FIG. 7 is a graph 700 of mean warp, e.g. average 4-corner warp 707, versus Temperature (C) 708 illustrating the Shape Inversion Temperature (STI) 425 for a first 150A and second 150B substrate. The SIT-B (425, 725B) for the second 150B substrate is shifted higher by a temperature shift amount 750 than the SIT-A (425, 725A) for the first 150A substrate.

FIG. 7 compares the first substrate 150A to the second substrate 150B. The second substrate 150B exhibited good reflow characteristics because the SIT-B 725B is above (225 C) the reflow temperature 475 and the substrate 150B did not have a convex 615 shape during reflow. In addition, since the thermal warp is relatively low for the second substrate 150B (the curve has low values and a slighter slope), the second substrate 150B is able to meet the room temperature 375 warp specifications as well.

Figure 8A:
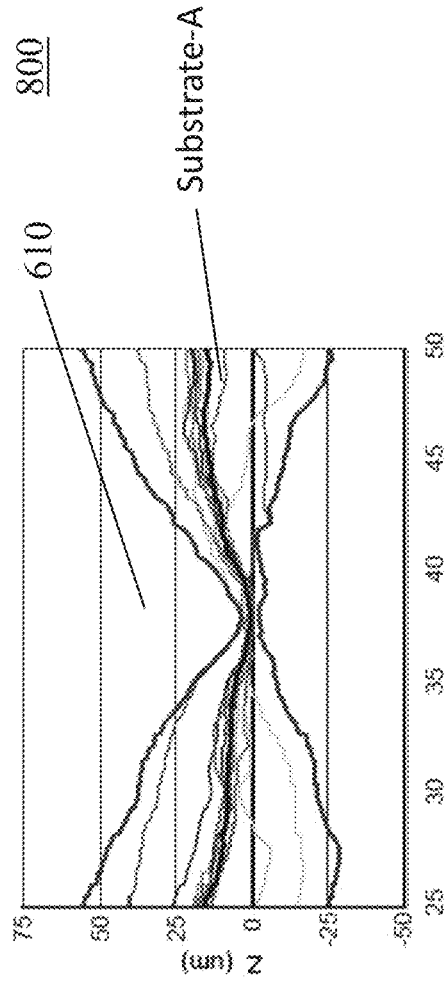
FIG. 8A is a warpage plot of a substrate for comparison with a warpage plot shown in FIG. 8B, where the comparison is done further in FIG. 9.
Figure 8B:
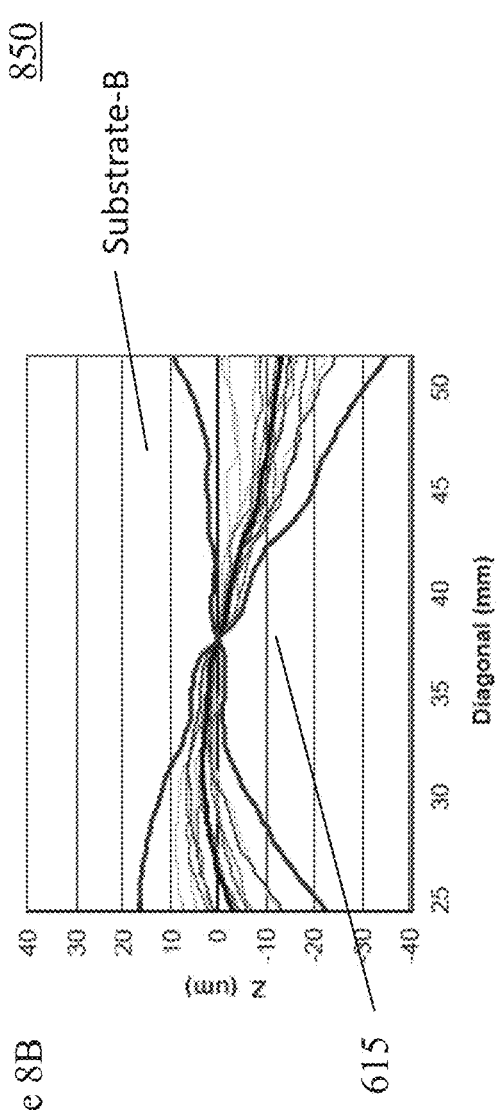
FIG. 8B is a warpage plot of a substrate for comparison with a warpage plot shown in FIG. 8A, where the comparison is done further in FIG. 9.
Figure 9:
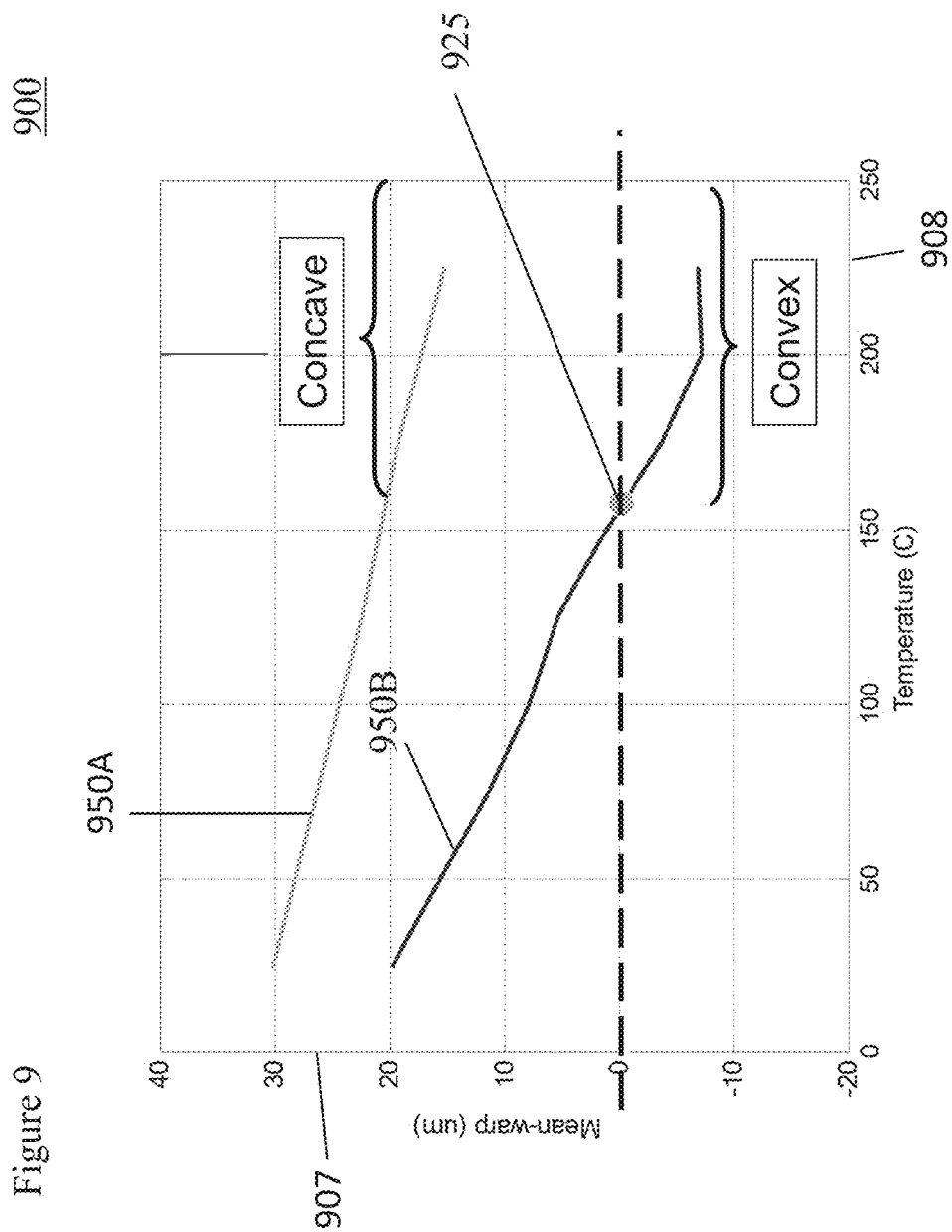
FIG. 9 is a graph of mean warp versus Temperature (C) comparing a first and second substrate.

FIGS. 8A and 8B show a comparison between the first (950A, 800) and second (950B, 850) substrate as described in FIG. 9 measuring the vertical 215 deviation created by warp along the diagonal transect line 125 at 225 C.

In FIGS. 8A and 8B, respective graphs 800 and 850 show the distribution of chip-site warp of 12 samples at 225 C. As can be observed, substrate-A (800, 950A) has a concave shape 610 while substrate-B (850, 950B) has a convex shape 615.

FIG. 9 is a graph 900 of mean warp, e.g. average 4-corner warp 907, versus Temperature (C) 908 comparing a first 150A and second 150B substrate. The warp of the first substrate (950A, 800) is concave throughout the entire temperature range on the X-axis 908 since all measures of mean warp were positive. Accordingly, the first substrate 950A is concave above the STI point 925.

All points of the second substrate 950B below the STI point 925 are positive, so the shape of the second substrate 150B is concave below the STI point 925. However, for temperatures above the STI point 925, the curve for the second substrate 950B turns negative. This indicates that if the reflow temperature is above the STI 725 the second substrate 950B will have a higher probability of poor connections.

Figure 10:
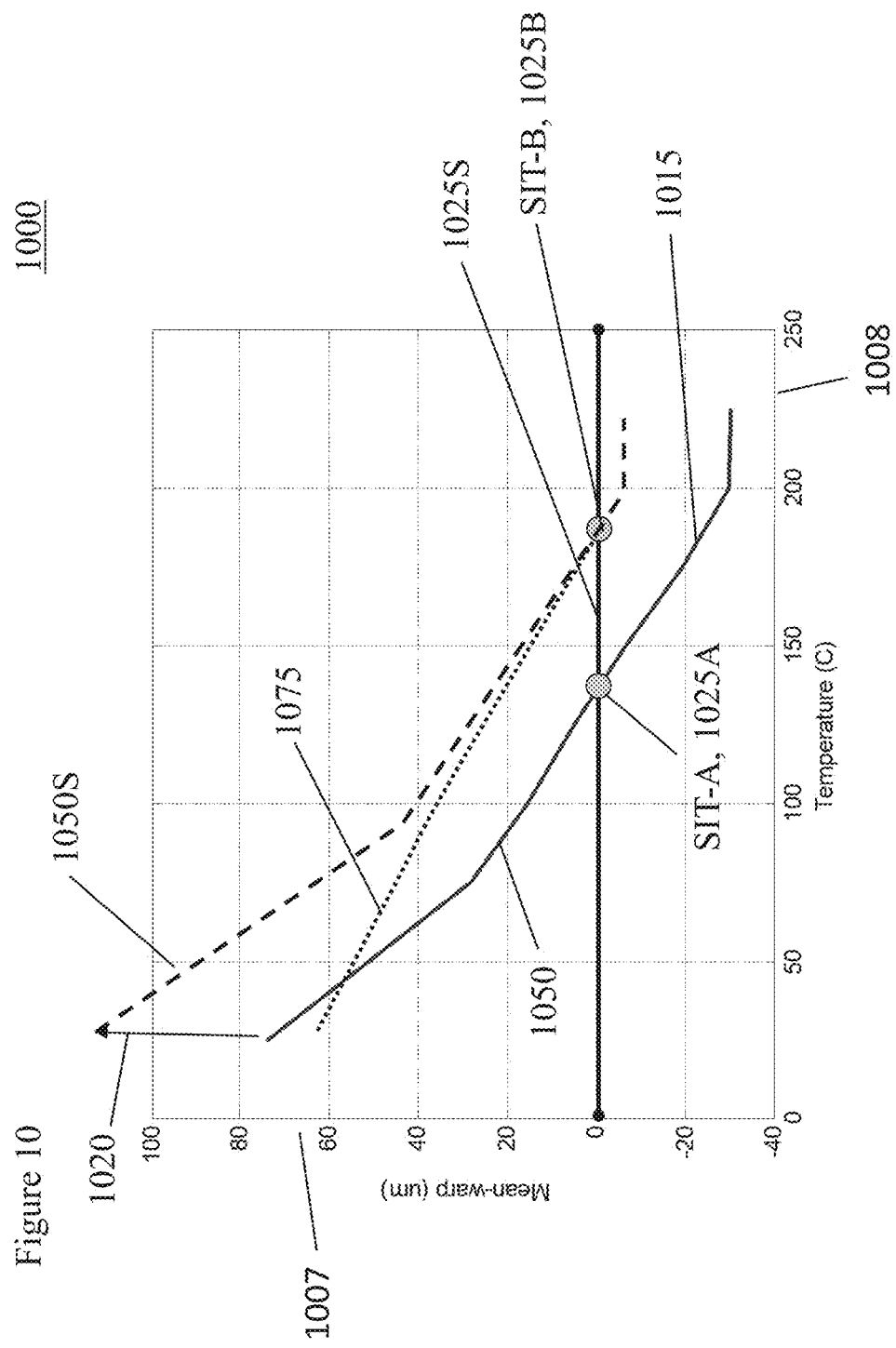
FIG. 10 is a graph of mean warp versus Temperature (C) of a substrate compared to the same mean warp curve shifted higher by a temperature shift amount and then modified.

FIG. 10 is a graph 1000 of mean warp, e.g. average 4-corner warp 907, versus Temperature (C) 908 of a substrate 1050 compared to the same mean warp curve shifted higher by a temperature shift amount 1025S and then modified. The methods of shifting and modifying these curves will be described below.

For some given substrates 150 with a low STI 625, the mean warp curve 1050 will have a large portion 1015 of negative mean warp. While a low amount of warp at room temperature 375 for these substrates 150 may be desirable, the substrate 150 is likely to have a convex shape (115, 415) at reflow temperature 475 because the STI (625, 1025A, SIT-A) is so low. Shifting 1025S the curve by a temperature shift amount 1025S to a higher SIT-B, 1025B can solve the convexity problem at reflow temperatures 475 but may cause new warp problems at room temperature 375.

Depending on the mean warp curve 1050 shape, the temperature shift 1025S may also cause a shift 1020 higher for warp at room temperature 375. In these cases, the mean warp curve 1050 needs both: 1. to be shifted by the temperature shift amount 1025S and 2. the warp curve 1050 needs to be reshaped.

In other words, in many embodiments, for a substrate with a known thermal warp (i.e., where the substrate 105 design is fixed), there is a tradeoff for reducing warp. A higher SIT produces desirable substrate shape (concave) 110 at reflow temperature 475 but increases the warp of the substrate 105 at room temperature 375. Lowering the SIT temperature produces improves room temperature 375 warp but degrades the substrate 150 shape (making it convex 115) at reflow temperature 475.

Aspects of the present invention reduce the room temperature 375 warp while preserving a high SIT 1025B. The warp curve 1050 is temperature shifted 1025S to maintain a concave 110 substrate 150 shape at reflow temperature 475 in combination with changing the warp curve shape 1075 to reduce the substrate 150 warp at room temperature 375.

FIG. 11A is a top horizontal cross section view 1180 of one or more of the top layers 280 of a typical organic substrate 150. The top layers buildup layers between the chip 105 and the core 285 are referred to as "FC" layers (Front Circuit). The chip 105 footprint 175 perimeter is shown in phantom view on the surface of the top layer 280.

FIG. 11B is a cross section elevation view 1140 of the organic substrate 150. As described in FIG. 2B above, there are one or more top layers 280, optionally one or more center or core layers 285, and one or more bottom layers 290 of the substrate 150. Warp deformation (270, 1111) in the Z-direction 215 occurs at the (X,Y) locations of the substrate 150 surface. The layers 290 on the side of the core 285 opposite the chip 105 are referred to as "BC" (Bottom Circuit) layers. As stated above, the FC layers or top layers 280 generally have dense interconnect structure made of metal lines, typically etched from a layer of copper deposited by means of a plating process. The BC layers 290 on the other hand tend to have a continuous sheet of copper with distributed holes for vias to pass through.

FIG. 11C is a top, horizontal cross section view 1190 of one of the bottom layers 290 with a continuous sheet of metal, e.g. a copper surface plating.

FIG. 11A shows removal of material 1050T, e.g. organic and/or metal material, from the surface of one or more top layers 280 of the substrate 150. The removal is done within the footprint 175 of the chip 105. Removal of surface material in this region decreases the amount of material that can expand and contract in this surface region 175 during thermal cycles and therefore reduces the CTE effects of warping 1170 in these top layers 280 in the chip 105 footprint 175. With diminished expansion and contraction in the footprint 175 region of one or more of the top layers 285 due to material removal 1050T, the shape of the warp curve 1050 changes. For example, in FIG. 10, the slope of warp curve 1050 will decrease and approach the lesser slope of warp curve 1075. The shape of the warp curve 1050 can also be made to change.

Note that in some embodiments, there is no removal of surface material from the top layers 280, but only removal from the bottom layers 290, as described below.

The material can be removed 1150T in various patterns. The amount and pattern 1150T of material removal will affect the slope and the shape of the warp curve (1050, 1075). In other words, by changing the removal pattern 1150T the thermal warp 300 described in the description of FIG. 3, or the change in warp for a given temperature change, is changed, particularly within the footprint 175.

In some embodiments, the material removed from within the footprint 175 is symmetrical. For example, the same amount of material is removed on either side of an X-direction, Y-direction, and/or diagonal line of symmetry (not shown). In other embodiments, e.g. where non-symmetric circuitry exists within the footprint 175 of one or more of the top layers 285 the removal of material can be non-symmetrical. In some embodiments, the removal pattern is "chevron-like", e.g. a series of spaced parallel lines. The spaced parallel lines can be along the edges of the footprint 175 and/or bend around corners of the footprint 175. The spacing between the lines can vary. The lines of material removal can cluster toward the edges of the footprint 175 and/or toward the center. In some embodiments, material removal patterns 1150T are envisioned with a pattern design specific to the material and material layout in the top layers 285 of each individual organic substrate 150 and how the shape/slope of the respective warp curve 1050 needs to be modified.

Embodiments are envisioned where material is removed in a removal pattern (1150T, 1150B) that can be within and/or without of the footprint 175. This is shown in the series of FIGS. 11D, 11E, and 11F.

FIG. 11D is a top horizontal cross section view 1180 as shown in FIG. 11A with a chevron-like removal pattern within the footprint 175. In the following described embodiments, variations of the removal pattern 1150T within the footprint 175 or no removal at all within the footprint 175 on the surface of one or more of the top layers 280 is envisioned.

FIG. 11E is a cross section elevation view 1145 of the organic substrate 150. Warp deformation (270, 1112) in the Z-direction 215 occurs at the (X,Y) locations of the in the substrate 150. The removal patterns 1150T within the footprint 175 primarily effect the deformation 1170 within the footprint 175. The removal patterns 1150B outside the footprint 175 primarily effect the deformation 1175 outside the footprint 175.

FIG. 11F is a top, horizontal cross section view 1195 of one or more of the bottom layers 290 with material removed from the surface of the layer 290 in a removal pattern 1150B. The removal pattern 1150 on the surface of one or more of the bottom layers 290 removes material external/outside of the footprint 175. This material can include parts of the plated metal surface.

Analogous to before, the material removed in the removal pattern 1150B outside the footprint 175 can be symmetrical. For example, the same amount of material is removed on either side of an X-direction, Y-direction, and/or diagonal line of symmetry (not shown). In other embodiments, e.g. where non-symmetric circuitry or metal surface patterning exists outside the footprint 175 of one or more of the bottom layers 290 the removal of material may be non-symmetrical. In some embodiments, the removal pattern is "chevron-like", e.g. a series of spaced parallel lines. The spaced parallel lines can be along the outside edges of the footprint 175 and/or bend around outside corners of the footprint 175. The spacing between the lines can vary. The lines of material removal can be a varying distances away from the footprint 175. In some embodiments, material removal patterns 1150B are envisioned with a pattern design specific to the material and material layout in the bottom layers 290 of each individual organic substrate 150 and how the shape/slope of the respective warp curve 1050 needs to be modified.

The effect of removal patterns 1150B outside the footprint 175 on the surface of one or more of the bottom layers 290 is to change the thermal warp 300 (the change in warp for a given temperature change) or the warp curve 1050 shape by primarily changing the warp 1175 outside the footprint. Generally, the warp 1170 inside the footprint 175 will be in the reverse Z-direction 215 from the warp 1175 outside the footprint 175 for the embodiments shown.

The removal pattern 1150B may also take into account the removal patterns 1150T on one or more of the top layers, warpage within the footprint 175, and/or the entire warp profile of the substrate 150.

Figure 12:
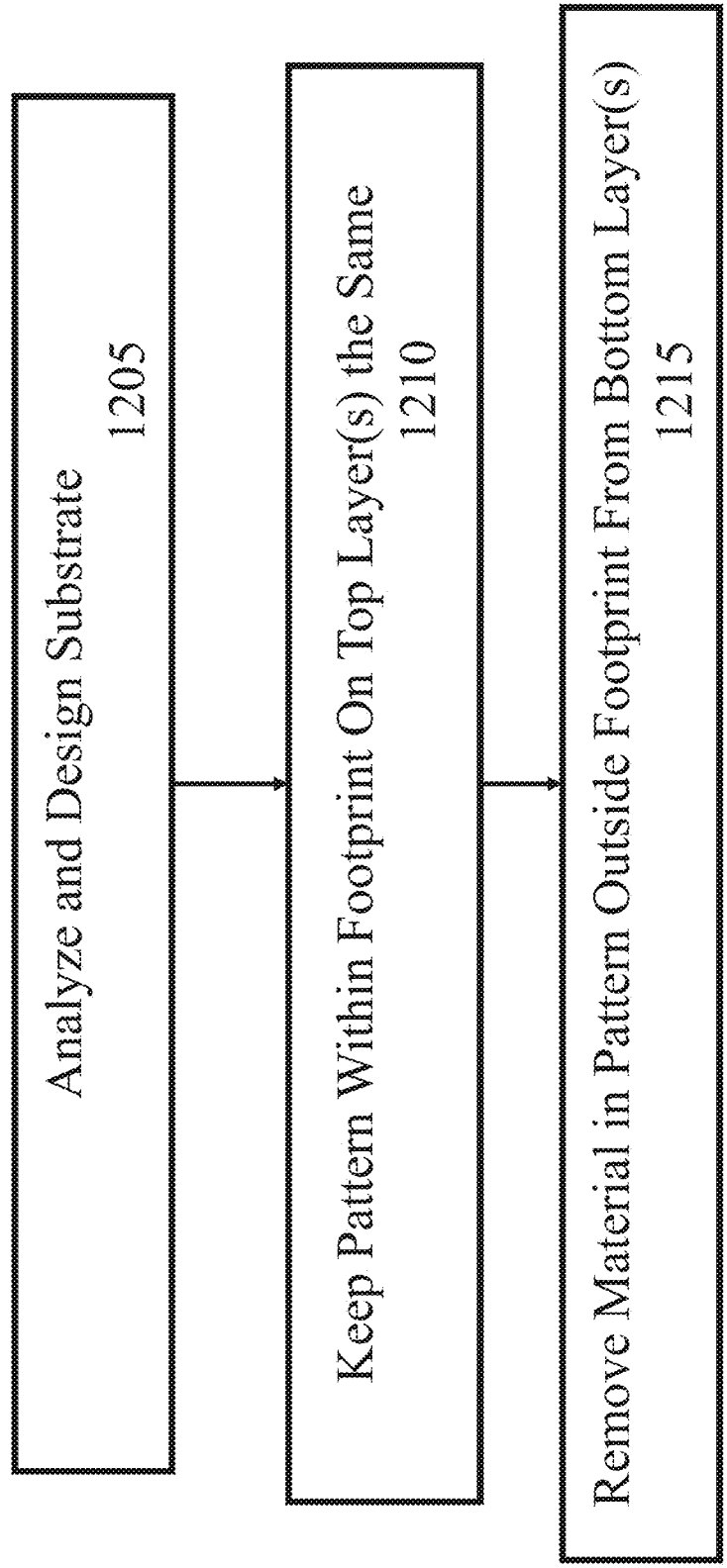
FIG. 12 is a flow chart showing the steps of a process for optimizing warp in organic substrates.

FIG. 12 is a flow chart showing the steps of a process 1200 for optimizing warp in organic substrates.

The process 1200 begins with step 1205 which determines whether the warpage is within a tolerance or not, e.g. during the design phase.

In some embodiments, if the warpage is outside of the tolerance, in step 1210, the pattern/material within the footprint 175 in the top layers is maintained the same.

If the warpage is outside the tolerance, in step 1215, material is removed in a removal pattern 1150B from the surface of one or more bottom layers 290 outside the footprint 175, as described above.

Embodiments are envisioned where aspects of this invention are combined in different ways to optimize the warp (1170, 1175), and the warp curve (1050, 1075), in multiple ways to achieve objectives like maintaining the shape of the substrate either concave (110, 610) or flat 620 at reflow temperatures 475 during reflow. One skilled in the art given this disclosure could design/optimize warp (1170, 1175) for a large number of layer configurations of the substrate 150 by adjusting the SIT (625, 725), top removal pattern 1150T, and/or bottom removal pattern 1150B, as disclosed.

Figure 13:
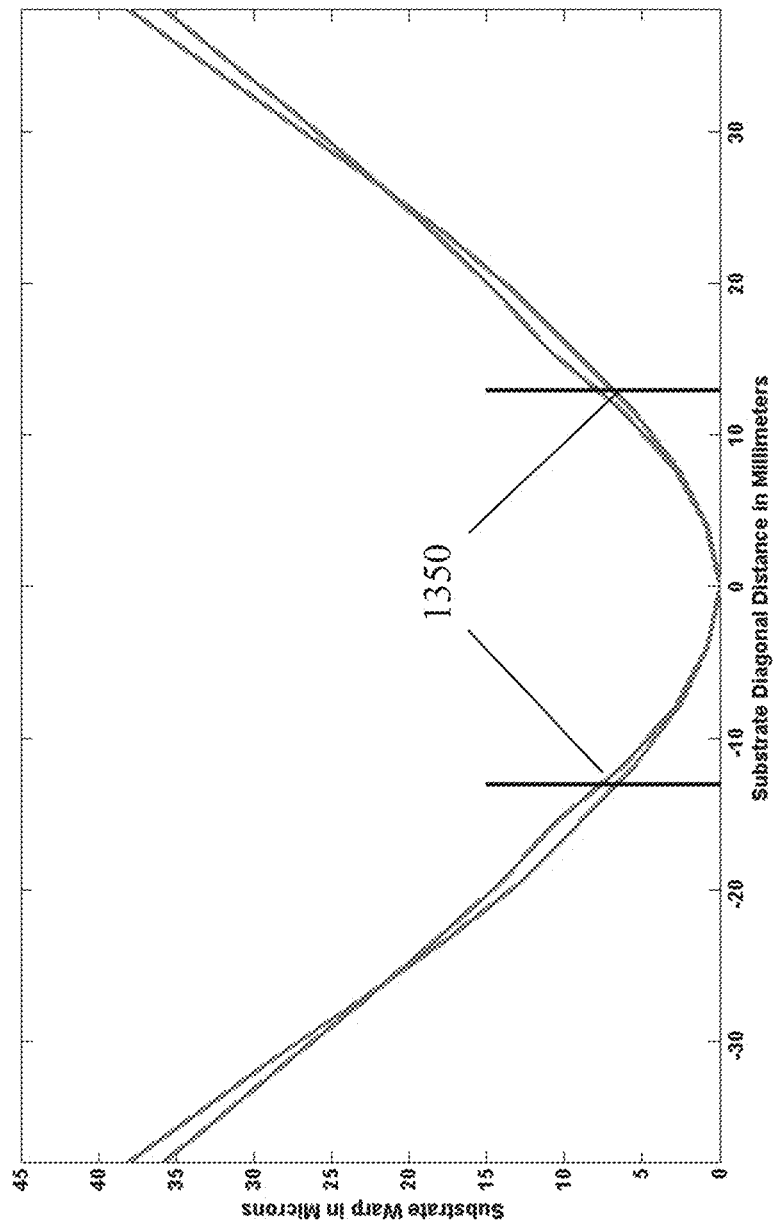
FIG. 13 is a graph 1300 showing a comparison between the designs shown in FIGS. 11C and 11F.

FIG. 13 is a graph 1300 showing a comparison between the designs shown in FIGS. 11C and 11F, the original and modified designs of the bottom layer(s), respectively.

In FIG. 13 the modified design shows a small improvement 1350 at room temperature, about 2.5 um at the substrate edges. This correlates to the far-left difference between 1050 and 1075 in FIG. 10, original and modified designs, respectively. More importantly, the SIT of the modified design has shifted to a much higher temperature, similar to 1025B, SIT-B and similar to 950A curve. Thus, avoiding going into convex shape and its previously mentioned solder joint contact problems at reflow temperature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. An organic substrate comprising:
    one or more top layers, layered on top of one another on top of a core;
    one or more bottom layers, layered on top of one another below the core;
    a chip footprint region on each of the top and bottom layers, the chip footprint region defined by a projection of a location one or more chips;
    one or more bottom removal patterns, one of the bottom removal patterns being at a location on and where material is removed material from a surface of one of the bottom layers outside of the chip footprint region,
    wherein the removal of the material from one or more of the bottom layers changes a thermal warp of the organic substrate, and
    wherein the bottom removal pattern is symmetrical about one or more lines of symmetry outside the chip footprint region.

2. A substrate, as in claim 1, further comprising one or more top removal patterns, one or more of the top removal patterns being at a location on and where material is removed from a surface of a top layer within the chip footprint region,
    wherein the removal of the material from one or more of the top layers and one or more of the bottom layers changes the thermal warp of the organic substrate.

3. A substrate, as in claim 2, where the top removal pattern is one or more top lines with a top line spacing between the lines.

4. A substrate, as in claim 3, where the top line spacing is not equal.

5. A substrate, as in claim 2, where the top removal pattern is symmetrical about one or more lines of symmetry within the chip footprint region.

6. A substrate, as in claim 2, where the top removal pattern is not symmetrical about a line of symmetry.

7. A substrate, as in claim 2, where the top removal pattern is in a chevron-like shape.

8. A substrate, as in claim 1, where the bottom removal pattern is one or more lines with a bottom line spacing between the lines.

9. A substrate, as in claim 8, where the bottom line spacing is not equal.

10. A substrate, as in claim 1, where the bottom removal pattern has one or more bottom lines that bend around one or more corners of the chip footprint region.

11. A substrate, as in claim 1, where the bottom removal pattern is in a chevron-like shape.

12. A substrate, as in claim 1, where the top removal pattern has one or more top lines that bend around one or more corners outside of the chip footprint region.

13. An organic substrate comprising:
    one or more top layers, layered on top of one another on top of a core plane;
    one or more bottom layers, layered on top of one another below the core plane;
    a chip footprint region on each of the top and bottom layers, the chip footprint region defined by a projection of a location one or more chips;
    one or more top removal patterns, one of the top removal patterns being at a location on and where material is not removed from a surface of one of the top layers within the chip footprint region;
    one or more of the bottom removal patterns, one of the bottom removal patterns being at a location on and where material is removed from a surface of a bottom layer outside the chip footprint region;
    a Shape Inversion Temperature (SIT) being equal to or above a fellow temperature, the SIT being the temperature at which the organic substrate changes a substrate shape from concave to convex and the reflow temperature being the temperature at which a solder melts to connect a semiconductor chip to the organic substrate,
    wherein the removal of the material from one or more of the bottom layers changes a thermal warp of the organic substrate so that the substrate shape is concave at the reflow temperature.

14. A substrate, as in claim 13, where one or more of the bottom removal patterns is in a chevron-like shape.

15. A method of making an organic substrate comprising the steps of:
    patterning one or more bottom layers with a bottom removal pattern, one or more of the bottom removal patterns being at a location on and removing material from a surface of a bottom layer outside the chip footprint region;
    layering one or more top layers on each other and layering one or more bottom layers on each other and layering the top layers on the bottom layers; and
    curing the top layers and bottom layers at a cure temperature, the cure temperature being equal to or higher than a reflow temperature,
    wherein the removal of the material from one or more of the bottom layers changes a thermal warp of the organic substrate so that a shape of the organic substrate is concave at the reflow temperature.

16. A substrate, as in claim 15, where the bottom layers are made of one or more of the following: a metal, a copper metal, an organic material, a fiber reinforced organic material, a photosensitive resin; and a resin.

17. A substrate, as in claim 15, wherein a Shape Inversion Temperature (SIT) is made equal to or higher than the reflow temperature, the SIT being the temperature at which the organic substrate changes a substrate shape from concave to convex and the reflow temperature being the temperature at which a solder melts to connect a semiconductor chip to the organic substrate.

18. A substrate, as in claim 15, where one or more of the bottom removal patterns are in a chevron-like shape.

* * * * *